(12) United States Patent
Eida et al.

(10) Patent No.: US 7,923,917 B2
(45) Date of Patent: Apr. 12, 2011

(54) COLOR CONVERSION LAYER AND LIGHT-EMITTING DEVICE

(75) Inventors: Mitsuru Eida, Sodegaura (JP); Hitoshi Kuma, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 972 days.

(21) Appl. No.: 10/574,284

(22) PCT Filed: Sep. 17, 2004

(86) PCT No.: PCT/JP2004/013610
§ 371 (c)(1),
(2), (4) Date: Mar. 31, 2006

(87) PCT Pub. No.: WO2005/034582
PCT Pub. Date: Apr. 14, 2005

(65) Prior Publication Data
US 2007/0121129 A1 May 31, 2007

(30) Foreign Application Priority Data
Oct. 1, 2003 (JP) ................................. 2003-342900

(51) Int. Cl.
*H01L 33/00* (2010.01)
(52) U.S. Cl. .................... 313/501; 313/502; 313/512
(58) Field of Classification Search .......... 313/501–503, 313/504, 512
See application file for complete search history.

(56) References Cited

U.S. PATENT DOCUMENTS

| | | | | |
|---|---|---|---|---|
| 3,510,333 A * | 5/1970 | Gonick et al. | ................ | 106/446 |
| 6,791,259 B1 * | 9/2004 | Stokes et al. | ................ | 313/503 |
| 2002/0063520 A1 * | 5/2002 | Yu et al. | ......................... | 313/512 |
| 2003/0127968 A1 * | 7/2003 | Kuma et al. | ................... | 313/503 |
| 2003/0132701 A1 * | 7/2003 | Sato et al. | ...................... | 313/503 |
| 2004/0252933 A1 * | 12/2004 | Sylvester et al. | ............... | 385/15 |
| 2007/0001182 A1 * | 1/2007 | Schardt et al. | .................. | 257/98 |

FOREIGN PATENT DOCUMENTS

| | | |
|---|---|---|
| EP | 0 884 370 A2 | 12/1998 |
| JP | 10-338872 | 12/1998 |
| JP | 11-297477 | 10/1999 |
| JP | 2000-212554 | 8/2000 |
| JP | 2001-119075 | 4/2001 |
| JP | 2001-223078 | 8/2001 |
| JP | 2002-216962 | 8/2002 |
| JP | 2004-273137 | 9/2004 |
| JP | 2004-311153 | 11/2004 |

OTHER PUBLICATIONS

U.S. Appl. No. 11/488,724, filed Jul. 19, 2006, Eida.
U.S. Appl. No. 11/406,316, filed Apr. 19, 2006, Eida, et al.

* cited by examiner

*Primary Examiner* — Karabi Guharay
(74) *Attorney, Agent, or Firm* — Oblon, Spivak, McClelland, Maier & Neustadt, L.L.P.

(57) ABSTRACT

A color conversion layer is provided which is capable of converting light from an emitting medium effectively to light containing a ray having a longer wavelength and exhibits less deterioration so as to have a long lifetime. The color conversion layer comprising a fluorescent medium for converting light emitted from an emitting medium to light having a longer wavelength, and having a haze value of 50% to 95%. The color conversion layer can be made thin, since the layer can efficiently convert the color of light from an emitting medium. The processability such as patterning thereof is then improved.

19 Claims, 3 Drawing Sheets

COLOR CONVERSION LAYER AND LIGHT-EMITTING DEVICE

TECHNICAL FIELD

The invention relates to a color conversion layer. More specifically, the invention relates to a color conversion layer which is used in combination with an emitting medium and constitutes a multicolor-light emitting apparatus or the like.

BACKGROUND ART

In the case of converting light from an emitting medium to light containing a component having a longer wavelength light ray, there is generally used a color conversion layer (fluorescent medium layer) which absorbs light (for example, light in a blue range) from the fluorescent medium and emits fluorescence having a longer wavelength.

At this time, the color conversion cannot be effectively attained since the light from the emitting medium is not sufficiently absorbed by the color conversion layer and the fluorescence therefrom is hindered from being taken outside because of self-absorption of the fluorescent medium in the color conversion layer.

Incidentally, a structure wherein light-scattering particles are dispersed into a color conversion layer has been investigated. As a result, it is disclosed that the lifetime of a color conversion filter is improved (see, for example, Japanese Patent Application Laid-open No. 2002-216962).

However, more efficient color conversion cannot be attained only by dispersing light-scattering particles into a color converting layer.

A fluorescent material in a color conversion layer may interact with light-scattering particles to cause extinction of fluorescence, or the color conversion efficiency thereof may be lowered with the passage of time by light from an emitting medium.

Accordingly, it has been desired to make clear a physical range in which color conversion can be more efficiently attained and thus develop a color conversion layer which exhibits only a small deterioration with the passage of time.

DISCLOSURE OF THE INVENTION

In light of the above-mentioned problems, the invention has been made, and an object thereof is to provide a color conversion layer which is capable of converting light from an emitting medium effectively to light containing a ray having a longer wavelength and exhibits less deterioration so as to have a long lifetime.

In order to solve the problems, the inventors have made eager investigations to find out that the conversion efficiency of a color conversion layer can be improved by controlling the haze value of the color conversion layer into a predetermined range.

According to the invention, the following color conversion layer, luminescent device and display are provided:

1. A color conversion layer including a fluorescent medium for converting light emitted from an emitting medium to light having a longer wavelength, and having a haze value of 50% to 95%.
2. The color conversion layer according to the item 1, including particles of an organic material and/or an inorganic material.
3. A color conversion layer including: a fluorescent medium for converting light emitted from an emitting medium to light having a longer wavelength, and particles of an organic material and/or an inorganic material coated with a material suppressing extinction of the fluorescent medium.
4. The color conversion layer according to the item 3 that has a haze value of 50% to 95%.
5. The color conversion layer according to any one of the items 1 to 4, wherein the fluorescent medium converts light in a blue range emitted from the emitting medium to light having a longer wavelength.
6. The color conversion layer according to any one of items 2 to 5, wherein the particles of an inorganic material include an inorganic oxide, an inorganic nitride or an inorganic oxynitride.
7. The color conversion layer according to item 6, wherein the inorganic material is a material selected from SiOx, SiNx, SiOxNy, AlOx, TiOx, TaOx, ZnOx, ZrOx, CeOx, and ZrSiOx wherein x is 0.1 to 2 and y is 0.5 to 1.3.
8. The color conversion layer according to any one of items 2 to 7, wherein the particles of an organic material and/or an inorganic material are hollow.
9. The color conversion layer according to any one of items 1 to 8, wherein a color filter is stacked.
10. The color conversion layer according to any one of items 1 to 8, wherein the color conversion layer is a layer in which a material of the fluorescent medium and a material of a color filter are mixed.
11. A luminescent device including: the color conversion layer according to any one of items 1 to 10, and an emitting medium.
12. The luminescent device according to item 11, wherein the emitting medium is a light emitting diode.
13. The luminescent device according to item 11, wherein the emitting medium is an electroluminescent device.
14. The luminescent device according to any one of items 11 to 13 that emits white light.
15. A display including a screen having the luminescent device according to any one of items 11 to 14.

According to the invention, a color conversion layer having a high color conversion efficiency can be provided by specifying a physical range for attaining color conversion more effectively. Moreover, a color conversion layer which is small in deterioration with the passage of time can be provided. Furthermore, the color conversion layer can be made thin so that the workability thereof, for patterning and so on, is improved.

BEST MODE FOR CARRYING OUT THE INVENTION

The invention will be specifically described hereinafter.
1. Color Conversion Layer The color conversion layer of the invention is a layer having a function of converting light emitted from an emitting medium to light containing a component having a longer wavelength light ray. For example, a blue light component (in the range of a wavelength of 400 to 500 nm), out of the light emitted from the emitting medium, goes through the color conversion layer, whereby the light component is converted to green or red light having a longer wavelength. The color conversion layer of the invention causes a part of the blue light component from the emitting medium to go through the layer, and further the layer can cause the component to be mixed with rays from yellow to red conversion light rays, whereby the light emitted from the emitting medium can be converted to white light.

This color conversion layer is characterized by having a haze value in the range of 50% to 95%. When the haze value is in this range, the color conversion efficiency of the color conversion layer can be improved. The haze value of the color conversion layer is preferably from 60% to 90%, more preferably from 65% to 85%.

Figure 1:
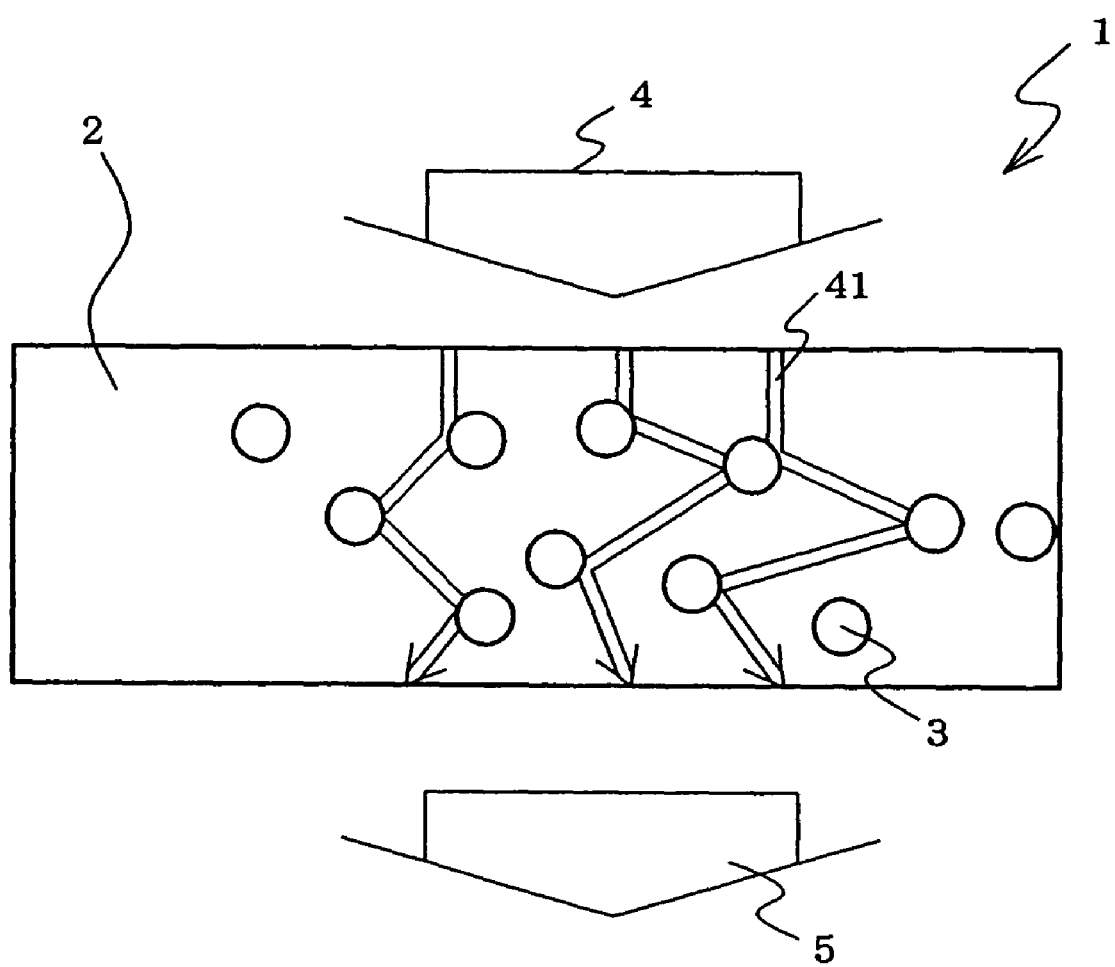
FIG. 1 is a schematic view of a color conversion layer of the invention.

FIG. 1 is a schematic view of a color conversion layer of the invention.

The color conversion layer 1 of the invention is composed of a binder resin moiety 2 wherein a fluorescent medium is dispersed, and particles 3. When light 4 from an emitting medium goes through the color conversion layer 1, the light 4 is converted to light having a long wavelength by the fluorescent medium. Transmitted light 5 is composed of light not converted by the fluorescent medium and the light which has undergone the conversion (conversion light), which has the long wavelength, or is made only of the conversion light.

About the color conversion layer 1 of the invention, the haze value thereof is made high by mixing the particles 3 with the binder resin moiety 2 wherein the fluorescent medium is dispersed. The state that the haze value is high means that the ratio of the scattered light ray transmissivity to the entire light ray transmissivity is high. Thus, a great amount of the light 4 radiated into the color conversion layer is scattered inside the layer, so that a long light path 41 is given in the color conversion layer 1.

Meanwhile, in the state that the haze value is low, the ratio of the parallel light ray transmissivity to the entire light ray transmissivity is high. Thus, a great amount of the light radiated into the color conversion layer 1 goes straightly through the layer without being scattered in the layer. Thus, the light path thereof is short.

When the light path inside the color conversion layer 1 is made long in this way, a larger amount of the incident light 4 from the emitting medium is absorbed in the color conversion layer 1. Consequently, the incident light can be effectively converted into a different color.

Additionally, the color conversion layer 1 can be made thin, and thus the workability thereof, for patterning and so on, is improved.

Furthermore, the conversion light is also scattered; thus, it appears that the conversion light to be taken outside is less subjected to total reflection on the interface with the air to produce an effect that the light is effectively taken outside.

The color conversion layer of the invention is not limited to the structure illustrated in FIG. 1. As will be described later, for example, the layer can be made only of a fluorescent medium without any binder resin being used. A structure wherein the particles 3 are not added is permissible as long as the haze value thereof is in the above-mentioned range.

In the specification, the haze value, the scattered light ray transmissivity and the parallel light ray transmissivity mean values measured by regulations in JIS K 7105.

The color conversion layer contains at least a fluorescent medium for converting the wavelength of incident light from an emitting medium and, if necessary, the layer may contain a binder resin, organic or inorganic particles for adjusting the haze value, or the like.

As the fluorescent medium, organic fluorescent media and inorganic fluorescent media which are ordinarily used, such as fluorescent colorants, can be used.

Examples of a fluorescent medium for converting rays from near ultraviolet rays to violet rays emitted from an emitting medium to blue light rays, out of the organic fluorescent media, include stilbene colorants, such as 1,4-bis(2-methylstyryl)benzene (Bis-MBS) and trans-4,4'-diphenylstilbene (DPS); and coumarin colorants, such as 7-hydroxy-4-methylcoumarin (Coumarin 4).

In the case of converting blue, blue green or white light rays to green light rays, examples of a fluorescent medium therefor include coumarin colorants, such as 2,3,5,6-1H,4H-tetrahydro-8-trifluormethylquinolizino(9,9a,1-gh) coumarin (Coumarin 153), 3-(2'-benzothiazolyl)-7-diethylaminocoumarin (Coumarin 6), 3-(2'-benzimidazolyl)-7-N,N-diethylaminocoumarin (Coumarin 7); Basic Yellow 51, which is another coumarin dye; and naphthalimide colorants, such as Solvent Yellow 11 and Solvent Yellow 116.

In the case of converting rays from blue to green light rays or white light rays to rays from orange to red light rays, examples of a fluorescent colorant therefor include cyanine colorants, 4-dicyanomethylene-2-methyl-6-(p-dimethylaminostyryl)-4H-pyran (DCM); pyridine colorants, such as 1-ethyl-2-(4-(p-dimethylaminophenyl)-1,3-butadienyl)-pyridinium perchlorate (Pyridine 1); rhodamine colorants, such as Rhodamine B, Rhodamine 6G, and Basic Violet 11; and oxazine colorants.

If various dyes (such as direct dyes, acid dyes, basic dyes, and disperse dyes) are fluorescent, any one of them can be selected as the fluorescent medium.

It is also allowable to use a pigment product wherein the fluorescent medium is beforehand kneaded into a pigment resin such as polymethacrylic ester, polyvinyl chloride, vinyl chloride/vinyl acetate copolymer, alkyd resin, aromatic sulfonamide resin, urea resin, melamine resin, orbenzoguanamine resin.

The inorganic fluorescent media that can be used may be metal compounds or other inorganic compounds which absorb visible rays from ultraviolet rays and emit fluorescence having a longer wavelength than the absorbed rays. It is allowable to modify the surface of the fluorescent medium with an organic material such as a long-chain alkyl group or phosphoric acid in order to improve the dispersibility thereof into the binder resin which will be described later. The use of the inorganic fluorescent media makes it possible to improve the endurance of the color conversion layer further. Specifically, the following can be used.

(a) Particles wherein a metal oxide is doped with a transition metal ion

Particles wherein a metal oxide such as $Y_2O_3$, $Gd_2O_3$, ZnO, $Y_3Al_5O_{12}$ or $Zn_2SiO_4$ is doped with a transition metal ion which absorbs from ultraviolet rays to visible rays, such as $Eu^{2+}$, $Eu^{3+}$, $Ce^{3+}$ or $Tb^{3+}$.

(b) Particles wherein a metal chalcogenide is doped with a transition metal ion

Particles wherein a metal chalcogenide such as ZnS, CdS or CdSe is doped with a transition metal ion which absorbs visible rays, such as $Eu^{2+}$, $Eu^{3+}$, $Ce^{3+}$ or $Tb^{3+}$. In order to prevent S, Se or the like from being drawn out by reaction components of the binder resin, which will be described later, the particles may be surface-modified with a metal oxide such as silica, or an organic material.

(c) Particles which absorb visible rays to emit light by use of the band gap of a semiconductor Semiconductor particles made of CdS, CdSe, CdTe, ZnS, ZnSe, InP or the like. About these, the particle size thereof is made into a nano size, whereby the band gap thereof can be controlled to change the absorption-fluorescent wavelength, as is known by Japanese Patent Application Publication No. 2002-510866 and other documents. In order to prevent S, Se or the like from being drawn out by reaction components of the binder resin, which will be described later, the particles may be surface-modified with a metal oxide such as silica, or an organic material.

For example, the surface of CdSe particles may be coated with a shell of a semiconductor material having a higher band gap energy, such as ZnS. According to this, the effect of confining electrons generated inside the particles at the center is easily produced.

The above-mentioned inorganic fluorescent media may be used alone or in combination of two or more thereof.

The binder resin is preferably a material having transparency (a light transmissivity of 50% or more to visible rays). Examples thereof include polyalkyl methacrylate, polyacrylate, alkyl methacrylate/methacrylic acid copolymer, polycarbonate, polyvinyl alcohol, polyvinyl pyrrolidone, hydroxyethylcellulose, carboxymethylcellulose, and other transparent resins (polymers).

In order to separate and arrange the color conversion layer two-dimensionally, a photosensitive resin to which photolithographic method can be applied is also selected. Examples thereof include acrylic acid based, methacrylic acid based, polyvinyl cinnamate based and cyclic rubber based optically curable resist materials, and other optically curable resist materials having a reactive vinyl group. In the case of using a printing process, a printing ink (medium) in which a transparent resin is used is selected. For example, the following can be used: a monomer, oligomer or polymer of polyvinyl chloride resin, melamine resin, phenol resin, alkyd resin, epoxy resin, polyurethane resin, polyester resin, maleic acid resin or polyamide resin, or a transparent resin such as polymethyl methacrylate, polyacrylate, polycarbonate, polyvinyl alcohol, polyvinyl pyrrolidone, hydroxyethylcellulose or carboxymethylcellulose.

For particles for controlling the haze value of the color conversion layer, there is a method of blending particles of an organic material and/or an inorganic material.

Examples of the organic material particles include vinyl polymers such as polymethyl methacrylate and polystyrene, melamine resin, polyamide resin, and epoxy resin.

Examples of the inorganic material particles include particles made of an inorganic oxide, an inorganic nitride or an inorganic oxynitride. The inorganic compound is specifically a material selected from SiOx, SiNx, SiOxNy, AlOx, TiOx, TaOx, ZnOx, ZrOx, CeOx, and ZrSiOx wherein x is 0.1 to 2 and y is 0.5 to 1.3. Of these, TiOx, ZnOx, ZrOx and CeOx are preferred.

A coating layer for suppressing extinction of the fluorescent medium can be formed on the surface of the particles. Examples of the coating layer for suppressing the extinction of the fluorescent medium include a layer for preventing the colorant or the binder resin from being broken down by the particles having photocatalyst effect, and a layer for making particles having semiconductivity insulative. Examples of the material for forming such a coating layer include alumina, zirconia, silica, zirconia silicate, alumina silicate, and glasses such as borosilicate glass.

The particles may be hollow. When the hollow particles are used, the difference in refractive index between the air (in the hollow portion) and the binder resin is large (the refractive index of the air is 1.0 while that of the binder resin is from approximately 1.5 to 1.6) so that the effect of scattering light is large. Oxygen in the air may favorably restrain the fluorescent medium from being deteriorated.

Of these particles, preferred are particles having a high refractive index or a low refractive index, specifically particles having a refractive index of 2.0 to 2.8 or 1.0 to 1.2. The use of such particles makes it possible to make the light path of light from an emitting medium long in the color conversion layer so that the color conversion layer can absorb the light from the emitting medium effectively. The particles make it possible to scatter conversion light so that the taking-out efficiency can be improved. Thus, the conversion efficiency of the color conversion layer can be improved. Examples of such particles include $TiO_2$ particles (refractive index=2.7), ZnO (refractive index=2.0), $CeO_2$ (refractive index=2.4), $ZrO_2$ (refractive index=2.2), hollow silica, and hollow glass.

The primary average particle diameter of the particles is not particularly limited if a haze value within the above-mentioned range is given. The particle diameter is preferably 1 nm or more and less than 100 nm, in particular preferably 5 nm or more and less than 80 nm. If the particle diameter is 100 nm or more, the particles are not uniformly dispersed in the color conversion layer so that uniform luminescence may not be obtained or the layer may not be patterned with high resolution by photolithography or the like. On the other hand, if the particle diameter is less than 1 nm, light may not sufficiently be scattered. In the color conversion layer, the particles may aggregate so that the diameter thereof may become 100 nm or more. However, no problem is caused when the primary average particle diameter is 1 nm or more and less than 100 nm.

The added amount of the particles in the color conversion layer is not particularly limited if a haze value within the above-mentioned range is given. Usually, the added amount is preferably more than 5% by weight and less than 70% by weight, in particular preferably more than 10% by weight and less than 50% by weight. If the amount is 5% or less by weight, light scattering may not be sufficiently caused. If the amount is 70% or more by weight, the color conversion layer may become mechanically brittle.

About the organic or inorganic fine particles, a single kind thereof may be used or two or more-kinds thereof may be used in a mixture form.

The method of forming the color conversion layer is roughly classified into two manners.

In the case that the color conversion layer is substantially only of a fluorescent medium, it is preferred to form the layer, through a mask for giving a desired color conversion layer pattern, on a substrate such as a glass plate by vacuum evaporation.

In the case that the color conversion layer is made of a fluorescent medium and a binder resin, it is preferred to mix, disperse or solubilize a fluorescent medium, a binder resin, and an appropriate solvent into a liquid, make the liquid into a film on a substrate by spin coating, roll coating, casting or some other method, and then pattern the film into a desired color conversion layer pattern by photolithographic method or pattern the liquid into a desired pattern by ink-jetting, screen printing or some other method to form the color conversion layer.

The thickness of the color conversion layer is not particularly limited if the layer sufficiently receives (absorbs) light emitted from an emitting medium and further the thickness does not hinder the function of the color conversion layer. However, for example, the thickness is preferably from 10 nm to 1,000 μm, more preferably from 0.1 to 500 μm, even more preferably from 2 to 100 μm.

This is based on the following reason: if the thickness of the color conversion layer is less than 10 nm, the fluorescent medium having a high concentration is necessary for absorbing light from an emitting medium so that concentration quenching may be caused; on the other hand, if the thickness of the color conversion layer is more than 1 mm, the light transmissivity thereof lowers remarkably so that the amount of light that can be taken outside decreases or an luminescent device wherein the layer is combined with an emitting medium may not be easily made thin.

It is preferred to use the color conversion layer of the invention in the state that the layer is stacked on a color filter. The stacked structure thereof on the color filter makes it possible to make better the color purity of light transmitted through the color conversion layer.

About the color filter, the material thereof is not particularly limited. The filter is made of, for example, a dye, a pigment and a resin, or only a dye or pigment. The color filter made of a dye, a pigment and a resin may be a color filter in the form of a solid wherein the dye and the pigment are dissolved or dispersed in the binder resin.

Preferred examples of the dye or pigment used in the color filter include perylene, isoindoline, cyanine, azo, oxazine, phthalocyanine, quinacridone, anthraquinone, and diketopyrrolo-pyrrole.

The color conversion layer of the invention may be a layer formed by mixing the fluorescent medium material contained in the above-mentioned color conversion layer with the color filter material. This makes it possible to give the color conversion layer a function of converting light emitted from an emitting medium and further a color filter function of improving color purity. Thus, the structure thereof becomes simple.

2. Luminescent Device

The luminescent device of the invention is a device wherein the above-mentioned color conversion layer is combined with an emitting medium.

It is sufficient that the emitting medium is a medium containing light in an ultraviolet-visible ray range, such as a white light source or a blue light source. There can used, for example, an organic electroluminescent device (the word "electroluminescent" is abbreviated to EL hereinafter), an inorganic EL device, a light emitting diode, a vacuum fluorescent display tube, a CRT, a plasma display panel (PDP), a liquid crystal display (LCD) or the like. Of these, a light emitting diode and an EL device are preferred since they are light and emit light with a high efficiency.

As the light emitting diode, the following can be used: for example, ones described in "Foundation and Application of Photoelectronics—From Light Emitting Diode to Application of Photocoupler and Infrared Optical Fiber, Hardware Design Series (8)", Transistor Technique Editorial Department; "Light Emitting Diode and Application thereof", Stanley Electric Co., Ltd. Research & Development Laboratory; "Light Emitting Diode", Yasuo Okuno (The Industrial Library); and others.

As the EL device, there can be used, for example, EL devices described in WO 02/017689, WO 03/043382, WO 03/069957, International Patent Application JP 03/02708, and others.

The method of combining the color conversion layer with the emitting medium may be a method ordinary for luminescent devices, such as a method of jointing a substrate on which the color conversion layer is formed to a substrate on which the emitting medium is formed with an adhesive, a method of stacking the emitting medium on to a substrate on which the color conversion layer is formed, a method of arranging the color conversion layer and the emitting medium in parallel on a substrate, or a method of molding the emitting medium with the color conversion layer.

EXAMPLES

The invention will be more specifically described by way of the following examples. The invention is not limited by these examples.

Any color conversion layer was evaluated by the following methods.
(1) Haze Value
An HGM-20DP (manufactured by Suga Test Instruments Co., Ltd.) was used to measure the haze value on the basis of JIS K7105.
(2) Luminance, and CIE chromaticity coordinates
They were measured with a chroma mater (CS100, manufactured by Minolta Co., Ltd.).
(3) Emission Spectrum
It was measured with a spectroradiometer (CS-1000, manufactured by Minolta Co., Ltd.).

Example 1

(1) Formation of a Color Conversion Substrate (A Transparent Substrate and a Red Conversion Layer)

The following were mixed: 70 mg of Coumarin 6, 30 mg of Basic Violet 11 and 30 mg of Rhodamine 6G as materials for a red conversion layer; 28.4 g of a solution of a copolymer made from methacrylic acid and methyl methacrylate (average molecular weight: 30000, acid value: 85, and refractive index: 1.5) in propylenegrycol methylether acetate (solid conlcentration: 35%) as a binder resin; and 17 g of cyclohexanone.

To 5.0 g of this mixed solution (solid concentration: 22%, and colorant concentration: 1.3% in the solid) were added 90 mg of titanium oxide particles coated with alumina (MT500HD manufactured by TAYCA CORPORATION, primary average particle diameter: 30 nm, and refractive index of titanium oxide: 2.7), and then the resultant solution was vigorously stirred to prepare a dispersion. At this time, the content of the titanium oxide particles coated with alumina was 7.5% by weight of the solid therein.

This dispersion was coated onto a 25 mm×50 mm×1.1 mm (thickness) of glass substrate (a blue plate manufactured by Geomatec Co., Ltd.) by spin coating, and the resultant was dried in an oven at 140° C. for 30 minutes to form a color conversion substrate (thickness of the color conversion layer: 10 μm).

The haze value of this substrate was 58.5%.

Since the haze value of the glass substrate is a low value of 0.1%, the substrate produces only a small effect onto a measured value to be obtained. The measured value can be regarded as the value of the color conversion layer.

Furthermore, in order to make the measurement of red conversion efficiency easy (takeout only red conversion light), a red filter (CRY-S840B, manufactured by FUJI FILM Arch Co., Ltd.) was formed on the glass substrate and then a red conversion layer was formed thereon in the same manner as described above.

The haze value of the red filter substrate is 1.9, and thus the haze of the red filter can substantially be ignored.
(2) Fabrication of an Emitting Medium (Organic EL Device)

Prepared was a 25 mm×75 mm×1.1 mm (thickness) glass substrate (a soda-line glass manufactured by GEOMATEC COMPANY, LIMITED) with an ITO film (formed by sputtering and having a thickness of 130 nm), and then the present substrate was washed with ultrasonic waves in pure water and isopropyl alcohol. The substrate was dried with air blow, and then treated with UV.

Next, the substrate was transferred into an organic vapor deposition apparatus (manufactured by ULVAC Japan Inc.), and then fixed onto a substrate holder.

The following were beforehand charged into heating boats made of molybdenum, respectively:
4,4',4"-tris[N-(3-methylphenyl)-N-phenylamino]triphenylamine (MTDATA) and 4,4'-bis[N-(1-naphthyl)-N-phenylamino]biphenyl (NPD) as hole injecting materials;
4,4'-bis(2,2-diphenylvinyl)biphenyl (DPVBi) as an emitting material; and tris(8-quinolinol)aluminum (Alq) as an electron injecting material. Furthermore, an AlLi alloy (Li concentration: 10% by atom) was fitted as a cathode onto a filament made of tungsten.

Subsequently, the pressure in the vacuum tank was reduced into $5 \times 10^{-7}$ torr. Thereafter, layers from a hole injecting layer to a cathode were successively stacked, without breaking the vacuum halfway, in the following order.

First, as the hole injecting layer, MTDATA was deposited at a vapor deposition rate of 0.1 to 0.3 nm/second into a film having a thickness of 60 nm and NPD was deposited at a vapor deposition rate of 0.1 to 0.3 nm/second into a film having a thickness of 20 nm.

DPVBi was deposited at a vapor deposition rate of 0.1 to 0.3 nm/second into a film having a thickness of 50 nm as an emitting layer. Alq was deposited at a vapor deposition rate of 0.1 to 0.3 nm/second into a film having a thickness of 20 nm as an electron-injecting layer. Furthermore, AlLi alloy were deposited at a vapor deposition rate of 0.5 to 1.0 nm/second into a film having a thickness of 150 nm as the cathode.

In this way, the organic EL device was formed on the substrate, and then this was transferred into a glove box, into which dry nitrogen was caused to flow, without causing the substrate to contact the atmosphere. Inside this glove box, the display area was covered with a soda-line glass as a sealing substrate. A cationic curable adhesive (TB3102, manufactured by Three Bond Co., Ltd.) was applied onto the periphery of the display, and then optically cured to seal the display area.

Next, a DC voltage of 8 V was applied between the ITO electrode and the cathode (ITO electrode: (+), and cathode: (−)). As a result, light was emitted at cross portions (pixels) of the electrodes.

Blue light was obtained, which had a luminance of 300 cd/m$^2$ and the following CIE chromaticity coordinates: X=0.16 and Y=0.15. The emission spectrum thereof was checked. As a result, the peak wavelength of the emission was 470 nm.

(3) Fabrication of an Luminescent Device

The side of the color conversion layer of the color conversion substrate with the red filter, which was formed in the above-mentioned item (1), and the side of the glass substrate (the side of the ITO electrode) of the organic EL device, which was formed in the above-mentioned item (2), were made opposite to each other, and these members were caused to adhere onto each other so as to interpose silicone oil therebetween, thereby fabricating an luminescent device.

The organic EL device was caused to emit light, and the light taken out from the color conversion substrate was measured. As a result, red light having CIE chromaticity coordinates of X=0.63 and Y=0.36 was obtained. The luminance was 108 cd/m$^2$ (conversion efficiency: 36.0%). Thus, it was proved that the efficiency was a high conversion efficiency.

The color conversion efficiency was calculated in accordance with the following equation:

Color conversion efficiency (%)=(Luminance after conversion/Luminance of emitting medium)×100

The content by percentage of the particles, the haze value and the color conversion efficiency of each of the color conversion layers formed in Example 1, and Examples 2 to 4 and Comparative Examples 1 to 4 which will be described later are shown in Table 1.

TABLE 1

|  | Particle content (wt %) | Haze value | Red conversion efficiency (%) |
|---|---|---|---|
| Example 1 | 7.5 | 58.5 | 36.0 |
| Example 2 | 10 | 69.5 | 37.8 |
| Example 3 | 20 | 84.8 | 37.8 |
| Example 4 | 30 | 89.2 | 36.8 |
| Comparative Example 1 | 0 | 6.4 | 30.8 |
| Comparative Example 2 | 1 | 16.4 | 31.6 |
| Comparative Example 3 | 3 | 30.8 | 33.9 |
| Comparative Example 4 | 5 | 40.8 | 33.0 |

Examples 2 to 4, and Comparative Examples 1 to 4

Red conversion layers were each formed and evaluated in the same way as in Example 1 except that the added amount of the titanium oxide particles coated with alumina was changed.

Figure 2:
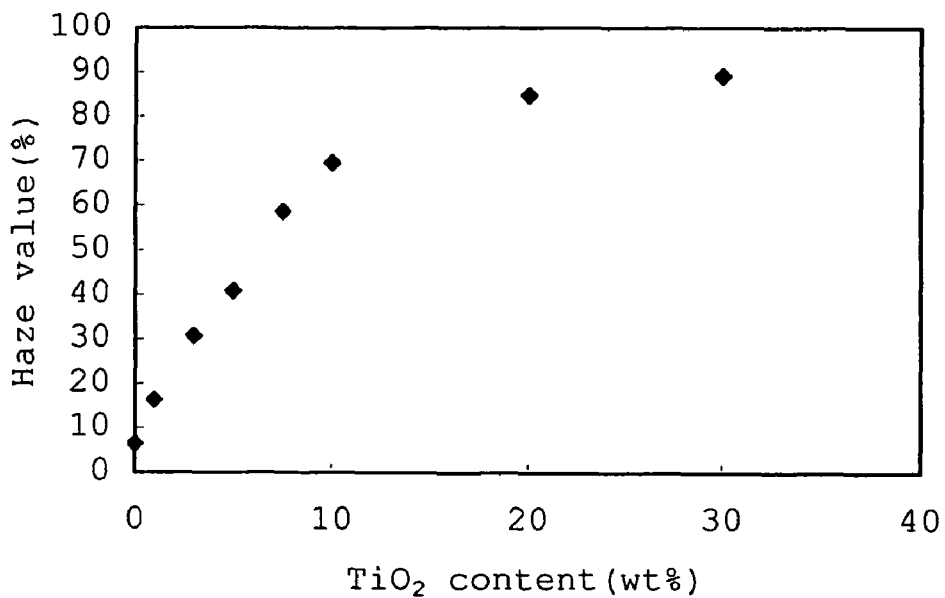
FIG. 2 is a graph showing a relationship between the content of particles and the haze value in Examples 1 to 4 and Comparative Examples 1 to 4.
Figure 3:
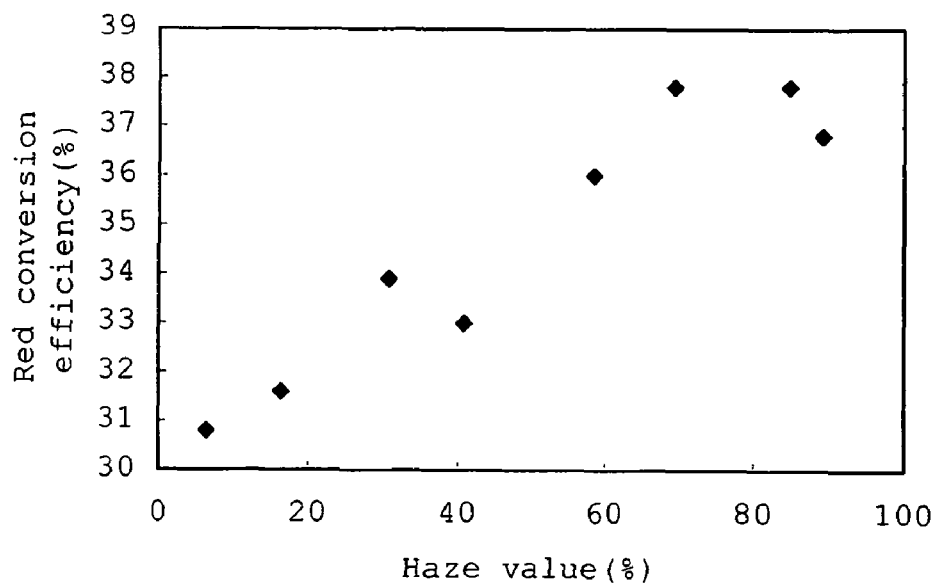
FIG. 3 is a graph showing a relationship between the haze value and the red conversion efficiency in Examples 1 to 4 and Comparative Examples 1 to 4.

A relationship between the particle content by percentage and the haze value in Examples 1 to 4 and Comparative Examples 1 to 4 is shown in FIG. 2. A relationship between the haze value and the red conversion efficiency is shown in FIG. 3.

It was demonstrated that when the content by percentage of the titanium oxide particles was adjusted in this way, the haze value was able to be controlled and the red conversion efficiency was high in the range of a haze value of 50% or more.

Example 5

The following were mixed: 70 mg of Coumarin 6 as a material for a green conversion layer; 28.4 g of a solution of a copolymer made from methacrylic acid and methyl methacrylate (average molecular weight: 30000, and acid value: 85) in propylene glycol methyl ether acetate (solid concentration: 35%) as a binder resin; and 17 g of cyclohexanone.

To 5.0 g of this mixed solution (solid concentration: 22%, and colorant concentration: 0.7% in the solid) were added 90 mg of titanium oxide particles coated with alumina (MT500HD manufactured by TAYCA CORPORATION, primary average particle diameter: 30 nm), and then the resultant solution was vigorously stirred to prepare a dispersion.

At this time, the content by percentage of the titanium oxide particles coated with alumina was 7.5% by weight of the solid therein.

Thereafter, a color conversion layer was formed and evaluated in the same way as in Example 1 except that a green filter (CG-8510L, manufactured by FUJIFILM Arch Co., LTD.) was used for conversion efficiency measurement.

The conversion efficiency of this color conversion layer was 98.8%, and the CIE chromaticity coordinates were as follows: X=0.22 and Y=0.63. Thus, green light was obtained with a high conversion efficiency.

The content by percentage of the particles, the haze value and the color conversion efficiency of each of the color conversion layers formed in Example 5, and Examples 6 and 7 and Comparative Examples 5 to 8 which will be described later are shown in Table 2.

TABLE 2

|  | Particle content (wt %) | Haze value | Green conversion efficiency (%) |
| --- | --- | --- | --- |
| Example 5 | 7.5 | 60.1 | 98.8 |
| Example 6 | 10 | 70.9 | 100.6 |
| Example 7 | 20 | 86.3 | 97.8 |
| Comparative Example 5 | 0 | 3.3 | 93.1 |
| Comparative Example 6 | 1 | 13.4 | 92.2 |
| Comparative Example 7 | 3 | 33.7 | 95.0 |
| Comparative Example 8 | 5 | 41.7 | 94.5 |

Examples 6 and 7, and Comparative Examples 5 to 8

Green conversion layers and luminescent devices were each formed and evaluated in the same way as in Example 5 except that the added amount of the titanium oxide particles coated with alumina was changed.

Figure 4:
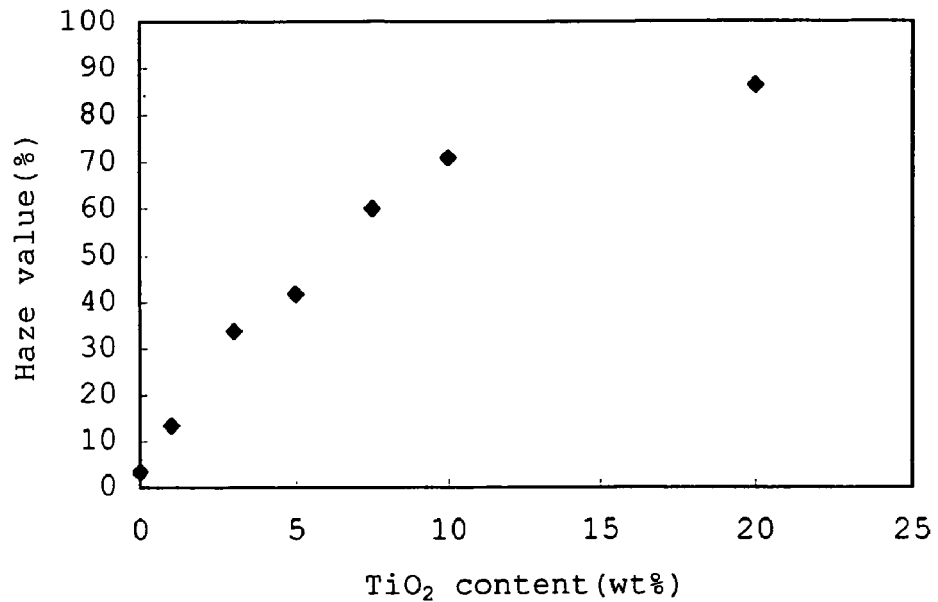
FIG. 4 is a graph showing a relationship between the content of particles and the haze value in Examples 5 to 7 and Comparative Examples 5 to 8.
Figure 5:
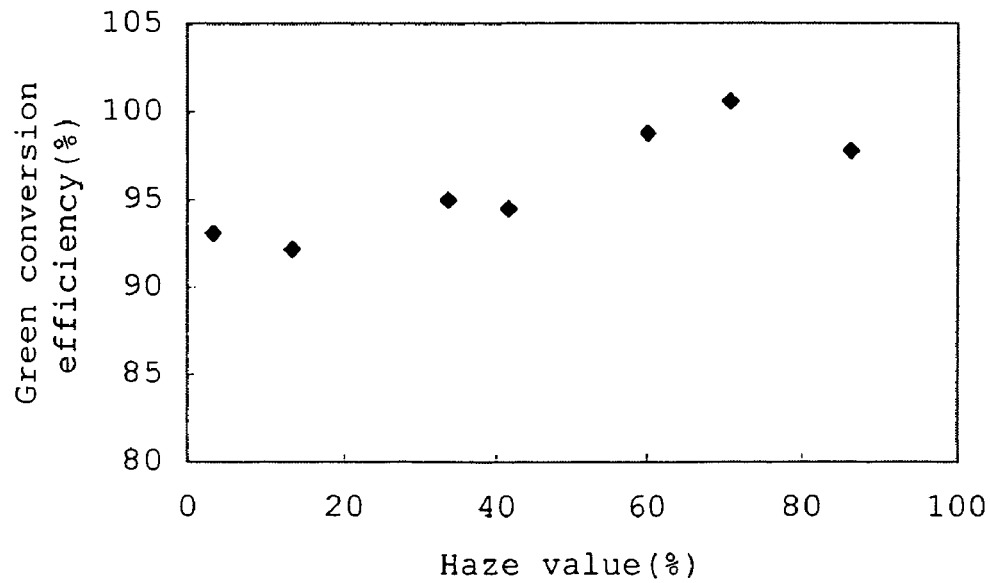
FIG. 5 is a graph, showing a relationship between the haze value and the green conversion efficiency in Examples 5 to 7 and Comparative Examples 5 to 8.

A relationship between the particle content by percentage and the haze value in Examples 5 to 7 and Comparative Examples 5 to 8 is shown in FIG. 4. A relationship between the haze value and the green conversion efficiency is shown in FIG. 5.

It was demonstrated that when the content by percentage of the titanium oxide particles was adjusted in this way, the haze value was able to be controlled and the green conversion efficiency was high in the range of a haze value of 50% or more.

Example 8

[Particle Surface Treatment Effect]

The red conversion substrate of Example 3 (red conversion efficiency: 37.8%) was further subjected to heat treatment at 200° C. in an oven for 30 minutes. As a result, the red conversion efficiency was somewhat lowered into 36.2%.

Furthermore, (GaN system) blue LED light (400 cd/m$^2$) was continuously radiated into this red conversion substrate in nitrogen to measure change with the passage of time in the red conversion efficiency and in the chromaticity. According to the blue LED light radiation for 1000 hours, the change rate of the red conversion efficiency was −5% or less, and the change in the chromaticity was 0.005 or less about each of CIEx and CIEy.

In this way, it was demonstrated that the changes in the conversion efficiency and the color of the red conversion substrate were small according to the heat treatment and the blue LED light radiation test.

Comparative Example 9

A red conversion layer was formed under the same conditions in Example 3 except that a red conversion layer to which titanium oxide particles (primary average particle diameter: 20 nm) not coated with alumina were added (the content by percentage of the titanium oxide particles was 20% by weight of solids therein) was used in the red conversion substrate of Example 3. At this time, the haze value of the red conversion substrate was 10.1, and the red conversion efficiency was 31.2%.

This substrate was subjected to heat treatment at 200° C. in an oven for 30 minutes in the same way as in Example 8. As a result, the red conversion efficiency was considerably lowered into 26.2%.

Furthermore, about this red conversion substrate, the same color LED light radiation test as in Example 8 was made. As a result, the change rate of the red conversion efficiency was −10%, and the change in the chromaticity was 0.009 about CIEx and 0.008 about CIEy. These were large changes.

A cause of the color change based on the heat treatment and the blue LED light radiation test is that the haze value was small, but the following are also presumed: the surface of titanium oxide was active since the surface of the added titanium oxide particles was not coated with alumina; and the photocatalyst effect of titanium oxide, and other effects caused extinction or deterioration of the red conversion colorant.

Example 9

[White Light Luminescent Device Based on Combination with an Emitting Medium]

A color conversion substrate was formed under the same conditions as in Example 3 except that the film thickness of the red conversion layer was changed from 10 μm to 4 μm. The haze value of this substrate was 66.3%.

This substrate was combined with an organic EL device under the same conditions as in Example 1, to fabricate an luminescent device. The organic EL device was caused to emit light, and the emitting light taken out from the color conversion substrate was measured. As a result, white light having CIE chromaticity coordinates of X=0.28 and Y=0.28 was obtained.

Example 10

An luminescent device was obtained in the same way as in Example 9 except that a (GaN system) blue LED was used as an emitting medium.

The blue LED was caused to emit light, and the light taken out from the color conversion substrate was measured. As a result, whit light having CIE chromaticity coordinates of X=0.28 and Y=0.28 was obtained.

Comparative Example 10

A color conversion substrate was formed under the same conditions as in Example 2 except that the film thickness of the red conversion layer was changed from 10 μm to 4 μm. The haze value of this substrate was 39.9%.

This substrate was combined with an organic EL device under the same conditions as in Example 1, so as to fabricate an luminescent device. The organic EL device was caused to emit light, and the emitting light taken out from the color conversion substrate was measured. As a result, the CIE chromaticity coordinates thereof were as follows: X=0.25 and Y=0.25. Thus, sufficient white light was not obtained.

When the film thickness of the red conversion layer was made large from 4 μm to 5 μm in the present example, white light having CIE chromaticity coordinates of X=0.28 and Y=0.28 was obtained. In other words, in order to obtain the same white light, the red conversion layer was required to have a thickness of 4 μm in Example 9, wherein the haze value was high, and the red conversion layer was required to have a thickness of 5 μm in the present example, wherein the haze value was low. It is therefore understood that when the haze value is made high, the color conversion layer can be made thin.

INDUSTRIAL APPLICABILITY

The color conversion layer of the invention makes it possible to attain effective color conversion of light from an emitting medium. Moreover, the color conversion layer can be made thin, and the workability thereof for patterning or others is improved. Furthermore, the layer is a color conversion layer small in deterioration with the passage of time.

Accordingly, the color conversion layer can be used in displays for industry or consumer products (cellar phones, cars, and household electric appliances), lighting, ornaments and so on).

The invention claimed is:

1. A color conversion layer, comprising:
   a fluorescent medium for converting light emitted from an emitting medium to light having a longer wavelength,
   particles of an organic material and/or an inorganic material with a coating layer formed from a material suppressing extinction of the fluorescent medium caused by the particles, and
   a binder resin in which the fluorescent medium and the particles with the coating layer are dispersed,
   wherein the fluorescent medium converts light in a blue range emitted from the emitting medium to light having a longer wavelength, and the color conversion layer has a haze value of 65 to 85%.

2. A luminescent device, comprising:
   the color conversion layer according to claim 1.

3. The luminescent device according to claim 2, wherein the emitting medium is a light emitting diode or an electroluminescent device.

4. The luminescent device according to claim 2 that emits white light.

5. A display comprising a screen including the luminescent device of claim 2.

6. The luminescent device according to claim 2, which further comprises:
   an emitting medium.

7. The luminescent device according to claim 2, wherein the color conversion layer has a haze value of 50% to 95%.

8. The color conversion layer according to claim 1, wherein the particles of an inorganic material comprise an inorganic oxide, an inorganic nitride or an inorganic oxinitride.

9. The color conversion layer according to claim 8, wherein the inorganic material is a material selected from $SiO_x$, $SiN_x$, $SiO_xN_y$, $AlO_x$, $TiO_x$, $TaO_x$, $ZnO_x$, $ZrO_x$, $CeO_x$ and $ZrSiO_x$ wherein x is 0.1 to 2 and y is 0.5 to 1.3.

10. The color conversion layer according to claim 1, wherein the particles of an organic material and/or an inorganic material are hollow.

11. The color conversion layer according to claim 1, wherein the color conversion layer is a layer in which a material of the fluorescent medium and a material of a color filter are mixed.

12. A color conversion substrate on which the color conversion layer according to claim 1 is formed.

13. The color conversion substrate according to claim 12, wherein a color filter is stacked on the color conversion layer.

14. The color conversion layer according to claim 1, wherein the coating layer is a layer for preventing the fluorescent medium from being broken down by the particles having photocatalyst effect or a layer for making the particles having semiconductivity insulative.

15. The color conversion layer according to claim 14, wherein the particles are titanium oxide particles coated with alumina.

16. The color conversion layer according to claim 1, wherein the coating layer is a layer for preventing the fluorescent medium or the binder resin from being broken down by the particles having photocatalyst effect or a layer for making the particles having semiconductivity insulative.

17. The color conversion layer according to claim 1, wherein the coating layer is formed from a material selected from the group consisting of alumina, zirconia, silica, zirconia silicate, alumina silicate, and glasses such as borosilicate glass.

18. The color conversion layer according to claim 1, wherein the binder resin is selected from the group consisting of polyalkyl methacrylate, polyacrylate, alkyl methacrylate/methacrylic acid copolymer, polycarbonate, polyvinyl alcohol, polyvinyl pyrrolidone, hydroxyethylcellulose, and carboxymethylcellulose.

19. The color conversion layer according to claim 1, wherein a primary average particles diameter of the particles is 1 nm or more and less than 100 nm.

* * * * *